US010467160B2

(12) United States Patent
Li et al.

(10) Patent No.: US 10,467,160 B2
(45) Date of Patent: Nov. 5, 2019

(54) MEMORY CHANNEL HAVING MORE THAN ONE DIMM PER MOTHERBOARD DIMM CONNECTOR (71) Applicant: Intel Corporation, Santa Clara, CA (US)

(72) Inventors: Xiang Li, Portland, OR (US); Yunhui Chu, Hillsboro, OR (US); Jun Liao, Hillsboro, OR (US); George Vergis, Portland, OR (US); James A. McCall, Portland, OR (US); Charles C. Phares, Federal Way, WA (US); Konika Ganguly, Portland, OR (US); Qin Li, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/719,742

(22) Filed: Sep. 29, 2017

(65) Prior Publication Data
US 2019/0102331 A1    Apr. 4, 2019

(51) Int. Cl.
G11C 5/02      (2006.01)
G06F 13/16    (2006.01)
G11C 5/06      (2006.01)
G06F 1/18      (2006.01)
H01R 12/73    (2011.01)
G11C 5/04      (2006.01)
G11C 7/10      (2006.01)

(52) U.S. Cl.
CPC .......... G06F 13/1694 (2013.01); G06F 1/185 (2013.01); G11C 5/04 (2013.01); G11C 5/06 (2013.01); G11C 5/063 (2013.01); H01R 12/73 (2013.01); G11C 7/10 (2013.01)

(58) Field of Classification Search
CPC ..... G11C 5/04; G11C 29/028; G11C 11/4076; G11C 2029/5004; G11C 29/56; G11C 29/56016; G11C 5/14; G11C 7/04; G11C 7/1045; G11C 13/0004; G11C 13/0007; G11C 13/004
USPC ........ 711/167, 105, E12.003, 104, 106, 115; 365/212, 222, 227, 229, 63
See application file for complete search history.

(56) References Cited

U.S. PATENT DOCUMENTS 6,178,526 B1 * 1/2001 Nguyen ................. G01R 31/01
                                                                  714/42
2008/0256281 A1 * 10/2008 Fahr ........................ G06F 13/16
                                                                  710/305

OTHER PUBLICATIONS

Starting on p. 4, paragraphs [0017] through paragraph [0023] only of U.S. Appl. No. 15/719,742, filed Sep. 29, 2017, pp. 4-6.

* cited by examiner

Primary Examiner — Thong Q Le
(74) Attorney, Agent, or Firm — Compass IP Law PC (57) ABSTRACT A method is described. The method includes receiving DDR memory channel signals from a motherboard through a larger DIMM motherboard connector. The method includes routing the signals to one of first and second smaller form factor connectors. The method includes sending the DDR memory channel signals to a DIMM that is connected to the one of the first and second smaller form factor connectors.

20 Claims, 13 Drawing Sheets

MEMORY CHANNEL HAVING MORE THAN ONE DIMM PER MOTHERBOARD DIMM CONNECTOR

FIELD OF INVENTION

The field of invention pertains generally to the computing sciences, and, more specifically, to a memory channel having more than one DIMM per motherboard DIMM connector.

BACKGROUND

A pertinent issue in many computer systems is the system memory (also referred to as "main memory"). Here, as is understood in the art, a computing system operates by executing program code stored in system memory and reading/writing data that the program code operates on from/to system memory. As such, system memory is heavily utilized with many program code and data reads as well as many data writes over the course of the computing system's operation. Finding ways to improve system memory accessing performance is therefore a motivation of computing system engineers.

FIGURES

A better understanding of the present invention can be obtained from the following detailed description in conjunction with the following drawings, in which.

DETAILED DESCRIPTION

Figure 1:
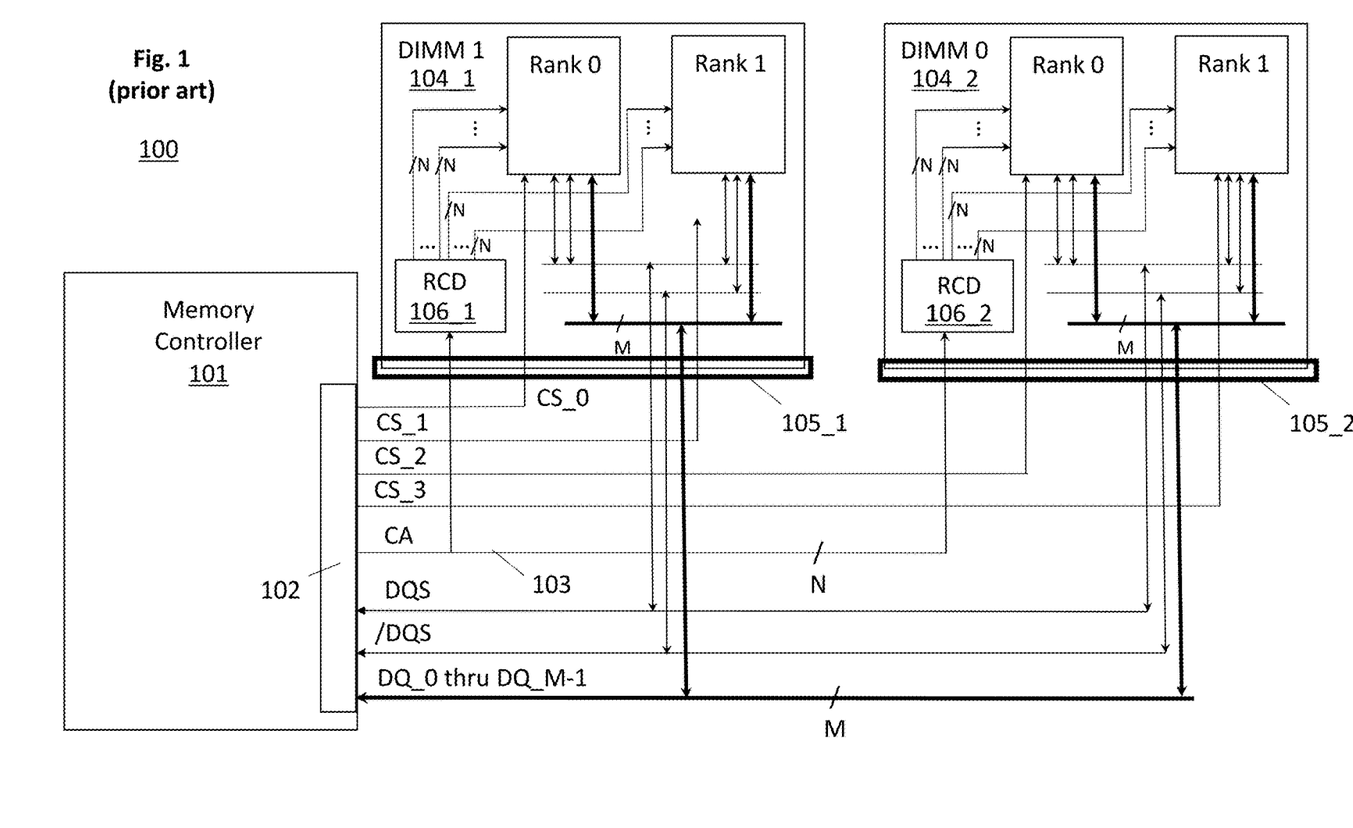
FIG. 1 shows a memory channel.

FIG. 1 shows a schematic diagram of a traditional system memory implementation 100. As observed in FIG. 1, the system memory implementation includes a memory controller 101 on the host side. The memory controller 101 includes a double data rate (DDR) memory bus interface 102 that is coupled to the wiring of a DDR memory bus (or channel) this is disposed, e.g., on the motherboard of a computing system. A DDR memory channel transfers data on both edges of a clock signal.

A pair of dual in line memory modules 104_1, 104_2 are coupled to the memory bus. The memory bus includes N control signal wires that together are referred are referred to as the CA bus 103. The control signals that are carried on the CA bus 103 include, to name a few, a row address strobe signal (RAS), column address strobe signal (CAS), a write enable (WE) signal and a plurality of address (ADDR) signals. As observed in FIG. 1, the control signals 103 are intercepted by a registering clock driver (RCD) circuit 106_1, 106_2 on each of the dual in line memory modules (DIMMs) 104_1, 104_2. A DIMM is traditionally implemented as an electronic card having memory chips disposed on both sides and connections on an edge for plugging into the motherboard of a computer.

Figure 2:
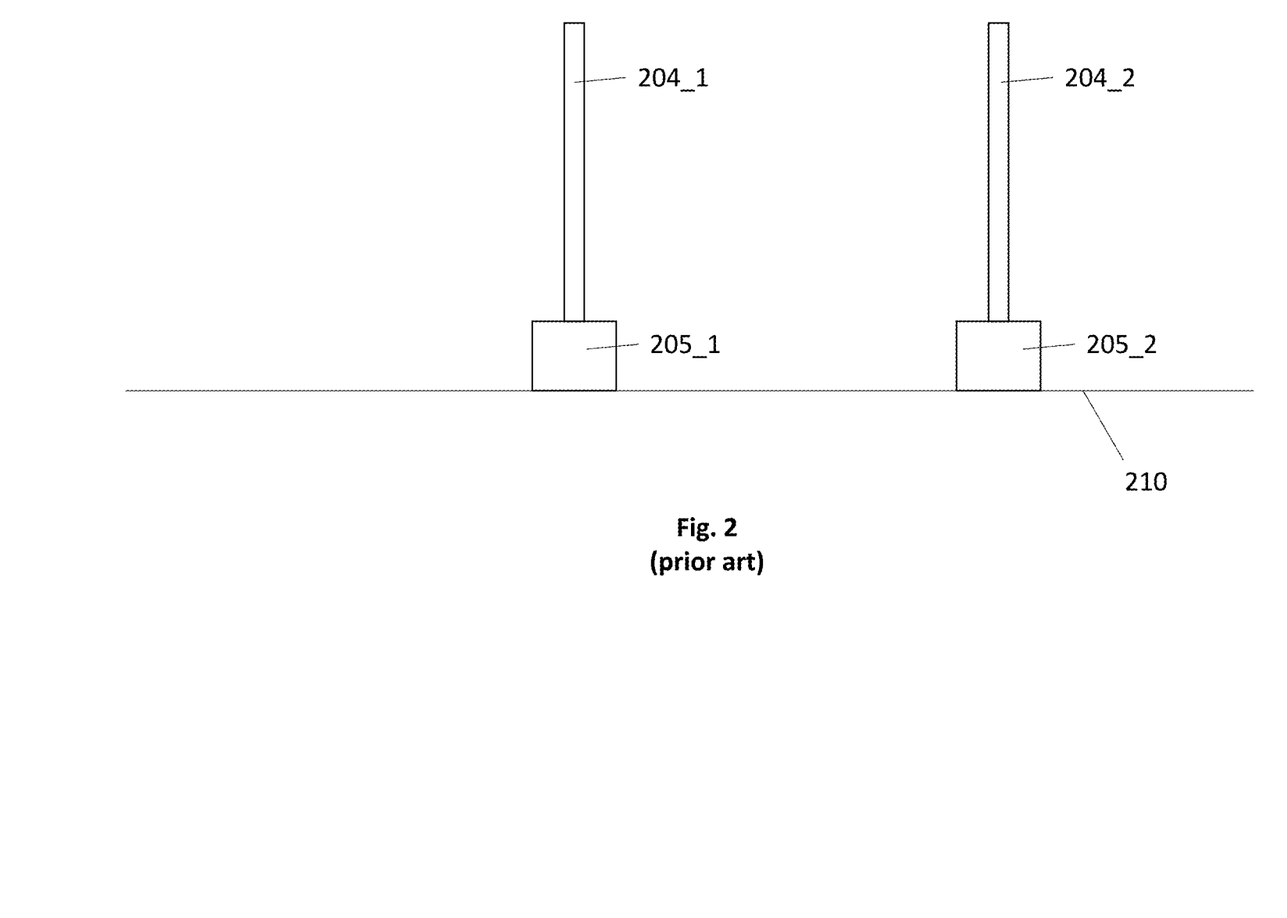
FIG. 2 shows a side view of a memory channel.

FIG. 2 shows a side view of a traditional DDR memory channel. As observed in FIG. 2, the memory channel includes a pair of large connectors 205_1, 205_2 that are mounted to the top surface of the motherboard 215. A respective DIMM 204_1, 204_2 plugs into each of the connectors 205_1, 205_2 to form a "two-DIMM" memory channel.

Figure 3:
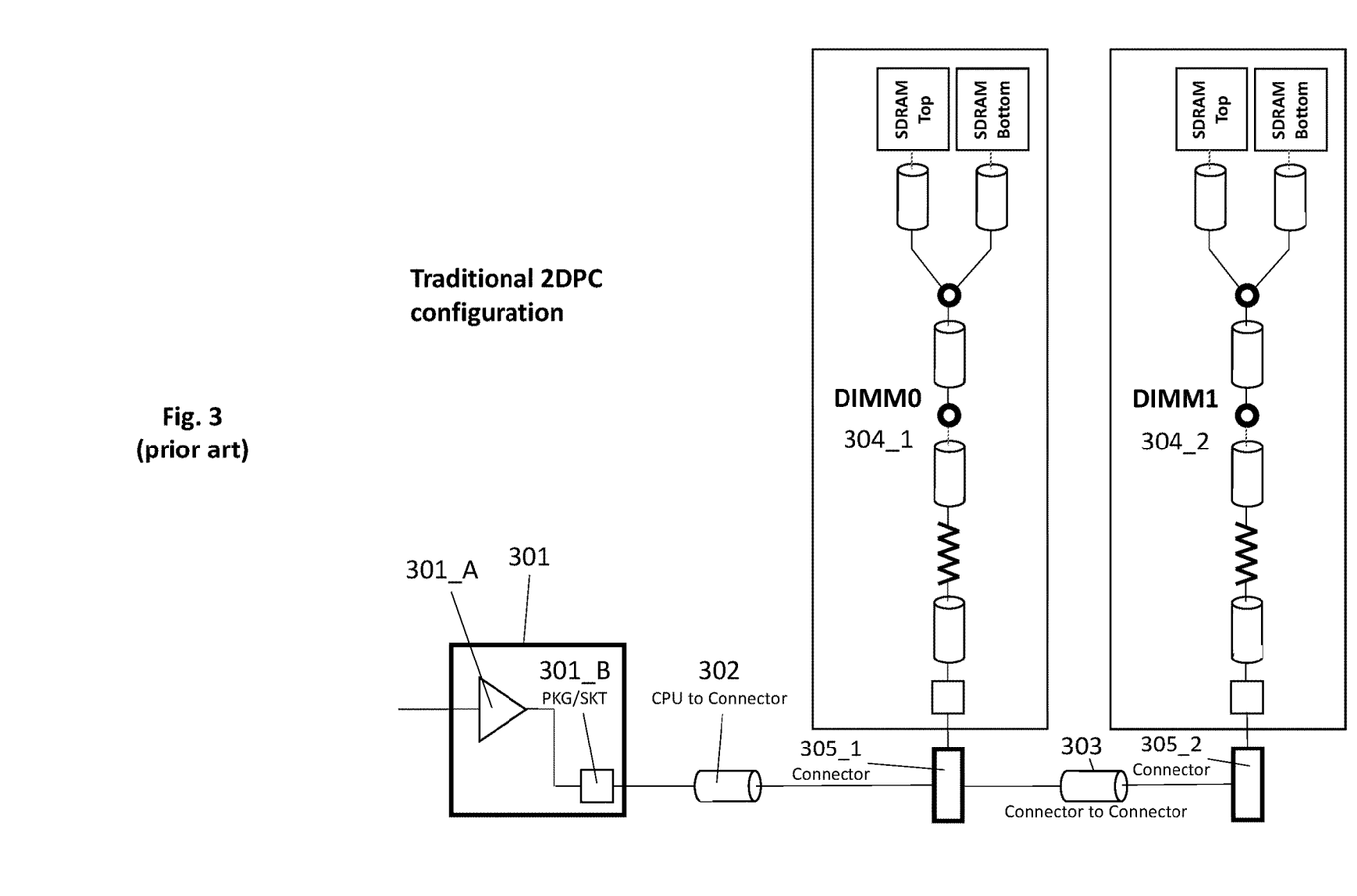
FIG. 3 shows a lumped element model of a memory channel.

FIG. 3 shows a lumped element circuit model of a traditional DDR memory channel. As observed in FIG. 3, the lumped element model includes: 1) the driver 301_A and package I/O 301_B of the semiconductor chip (e.g., multiprocessor system-on-chip (SoC)) that contains the memory controller; 2) the series resistance, series inductance and shunt capacitance 302 of the signal trace that runs on the motherboard to the first connector 305_1 of the first DIMM 304_1; 3) the connector 305_1 on the motherboard that the first DIMM 304_1; 4) the lumped element components of the first DIMM 304_1; 5) the series resistance, series inductance and shunt capacitance 303 of the signal trace that runs on the motherboard from the first connector 305_1 to the second connector 305_1 of the second DIMM 304_2; and, 6) the lumped element components of the first DIMM 304_2. Note that the signal trace on both DIMMs 304_1, 304_2 splits at the end (top of each DIMM as depicted in FIG. 3) to a top-side memory and bottom-side memory.

A problem with the traditional memory channel implementation of FIGS. 1 through 3 is the signal degradation that is induced into the channel by the DIMM connectors 105, 205, 305. Here as is known in the art, larger electrical connections generally include larger series inductance and larger shunt capacitance. The larger series inductance and larger shunt capacitance can induce a substantial change in the characteristic impedance of the channel (e.g., as compared to the characteristic impedance of the motherboard's signal traces or the DIMM cards' signal traces) and/or attenuate higher frequency signal components. Either of these affects can significantly degrade the quality of the signals that are received into either or both DIMMs in the case of a write operation or are received by the memory controller in the case of a memory read operation. As such, the large connectors 105, 205, 305 in the traditional memory channel solution of FIGS. 1 through 3 are significant impediments to improving the speed of present day memory channels.

Figure 4:
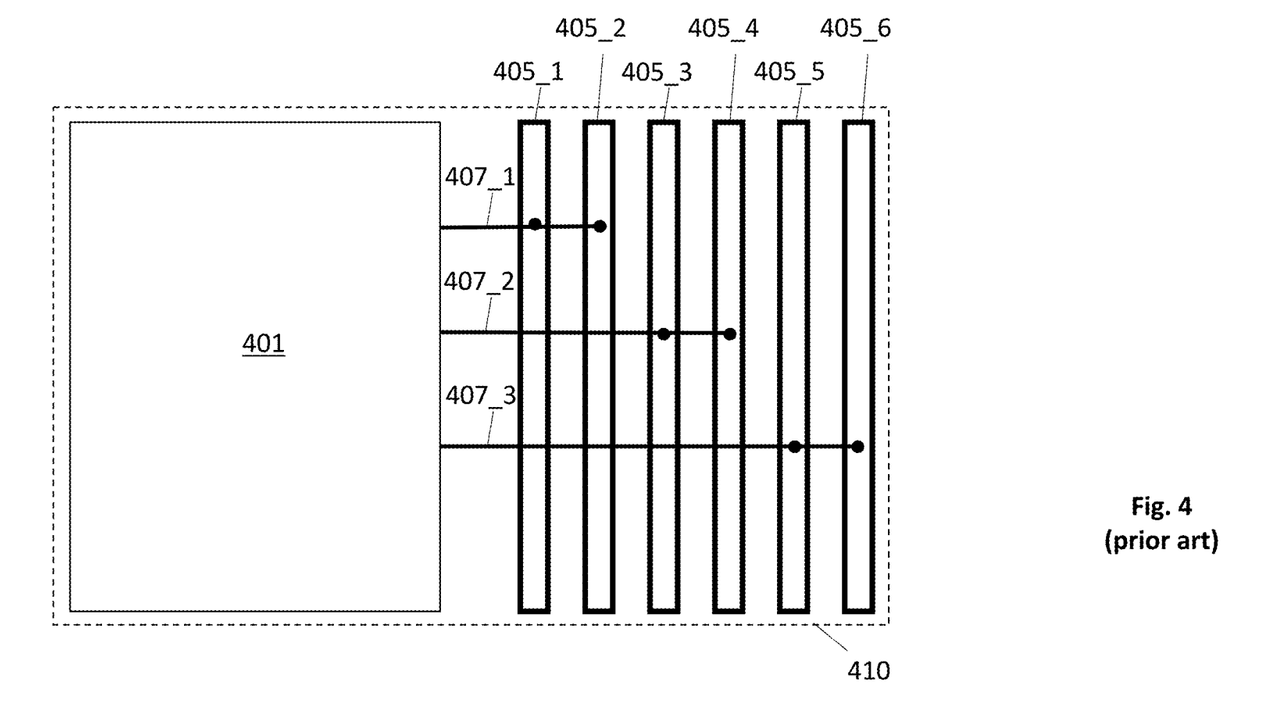
FIG. 4 shows a top down view of a memory channel.

FIG. 4 shows another problem with the traditional memory channel of FIGS. 1 through 3. FIG. 4 shows a top-down view of a computing system motherboard having three "two DIMM" memory channels. Here, space 401 corresponds to the motherboard surface area that is consumed by the semiconductor chip that includes the memory controller. Signal trace groups 407_1, 407_2 and 407_3 correspond to the motherboard wiring for each of three DDR memory channels (that is, signal trace group 407_1 corresponds to the wiring for a first memory channel, signal trace group 407_2 corresponds to the wiring for a second memory channel and signal trace group 407_3 corresponds to the wiring for a third memory channel).

The motherboard also includes six large connectors 405_1 through 405_6 to house six DIMMs, where, two DIMMs are to plug into each of the three memory channels. Specifically, connectors 405_1 and 405_2 are to house first and second DIMMs for the first memory channel, connectors 405_3 and 405_4 are to house third and fourth DIMMs for the second memory channel, and connectors 405_5 and 405_6 are to house first and second DIMMs for the third memory channel. As can be seen in FIG. 4, the connectors 405_1 through 405_6 are of such a large size that they need to be laterally stacked along the horizontal dimension of the motherboard surface. The lateral stacking of these large connectors consumes a large amount of the motherboard's surface area. As such, the large connectors not only impede progress on improving the performance of a memory channel but also are inefficient from the perspective of motherboard real estate efficiency.

Figure 5:
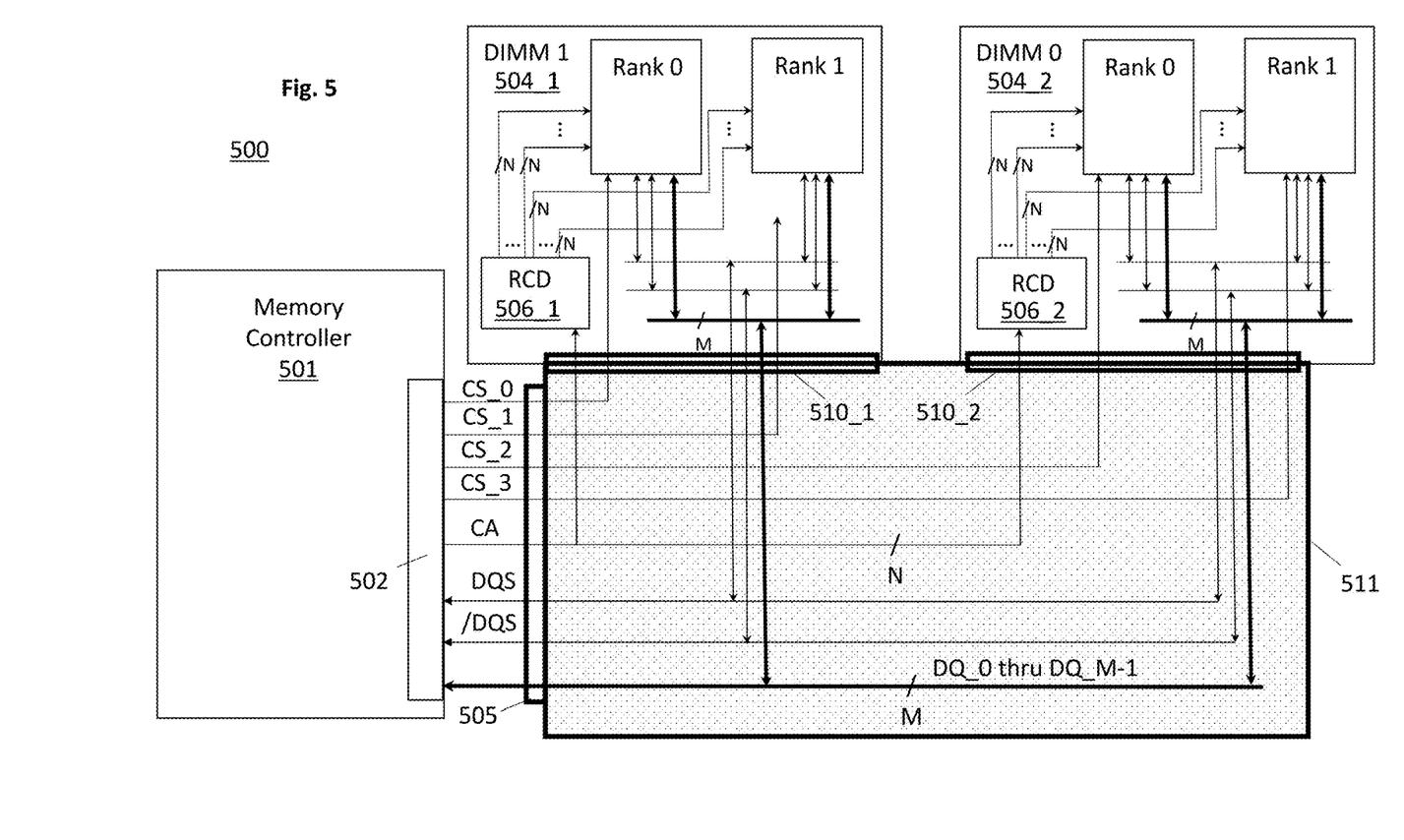
FIG. 5 shows an improved memory channel.
Figure 6:
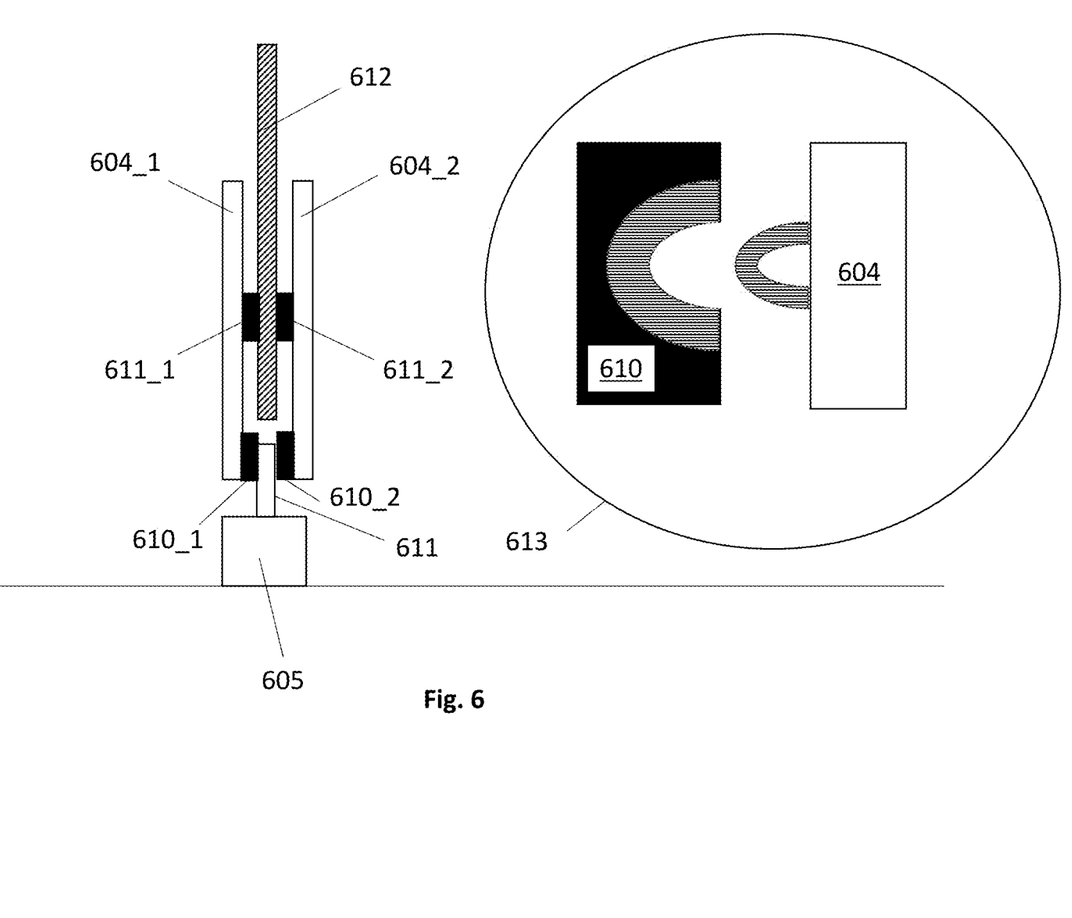
FIG. 6 shows a side view of an improved memory channel.

FIGS. 5 through 8 show corresponding figures for an improved solution that uses only one motherboard connector even though two DIMMs are still capable of being coupled to the memory channel. Referring to FIGS. 5 and 6, in the improved solution, an adapter card 511, 611 having a pair of smaller form factor connectors 510_1, 510_2; 610_1, 610_2 is plugged into the motherboard connector 505, 605. First and second DIMMs 504_1, 504_2; 610_1, 610_2 are respectively plugged into the smaller form factor connectors 510, 610. The adaptor card 511, 611 contains signal traces to properly route the DDR memory channel's wiring to both DIMM cards 504, 604. As such, both DIMMs 504, 604 are coupled to the motherboard but only one larger motherboard connector 505, 605 is utilized for the entire, complete channel.

Essentially, a single traditional motherboard connector has sufficient mass and structure to reliably support the weight of two DIMM cards. The improved solution takes advantage of this property to include only one large motherboard connector in a two-DIMM channel. By so doing, the channel can support higher frequency signals because the signal distortion that is imposed to the channel by larger connectors has been reduced approximately by half (one large connector vs. two large connectors). That is, the elimination of one larger motherboard connector 505, 605 as compared to the traditional implementation significantly improves the signal channel quality on the memory channel as a whole because the signal degradation affects caused by one large connector is removed from the overall channel.

FIG. 6 also shows that a thermally conductive structure 612 may be inserted between the two DIMMs 604_1, 604_2. The thermally conductive planar structure 612, in one embodiment, extends higher than the vertical profile of the DIMM cards 604_1, 604_2 so as to form a heat sinking "fin". In alternate or combined embodiments, the thermally conductive structure 612 may extend laterally (into the page of FIG. 6 or out of the page of FIG. 6) beyond one or both of the side edges of the DIMMs 604_1, 604_2. Here, any surface area of the thermally conductive planar structure 612 that extends beyond the planar surface of the DIMMs 604_1, 604_2 as they are connected to the adaptor card 611 will radiate heat that is generated by the semiconductor chips of the DIMMs that are located on the respective surfaces of the DIMMs that face a sibling DIMM. Here, for illustrative ease, FIG. 6 only shows two such chips 611_1, 611_2 (one for each DIMM 604_1, 604_2).

As can be observed in FIG. 6, the thermally conductive structure 612 is placed such that it fills space between the DIMMs 604_1, 604_2 and touches the top surfaces of the chips 611_1, 611_2. With the thermally conductive structure being in mechanical contact with the chips 611_1, 611_2, heat generated by the chips is able to transfer from the chips 611_1, 611_2 to the thermally conductive structure 612 from which it will be easily radiated from any surface area of the structure 612 that extends beyond the surface area of the DIMM cards 604_1, 604_2.

The structure 612 may be, e.g., epoxied to the surface of one of the DIMMs with thermally conductive epoxy. When the DIMM is plugged into the adaptor card, the structure 612 will naturally press against the other DIMM. In other or combined embodiments, one or both of the surfaces of the structure 612 that faces the DIMMs 604_1, 604_2 includes a mold-like surface structure that conforms to the topography of the DIMMs (e.g., has shallow regions that "fit over" the top surface of a DIMMs semiconductor chips) to enhance the mechanical stability of the structure's attachment to the DIMM(s) and/or the heat transfer efficiency from the DIMM(s) to the structure 612. The structure may be composed of any thermally conductive material (such as a metal or metal alloy).

Inset 613 of FIG. 6 shows one embodiment of the type of connection that is effected between a smaller form factor connector 610 and a DIMM 604. Here, as can be seen in inset 613, the smaller form factor connector 610 and DIMM 604 mate to one another with a "C" type connector. Here, the smaller metal "C" of the DIMM 604 inserts into and presses against the larger "C" of the connector 610. The DIMM's C connector extends upward from the surface of the DIMM that has semiconductor chips disposed on it and faces a sibling DIMM. Importantly, the radius or length of the connection corresponds to significantly less series resistance, series inductance and/or shunt capacitance than the larger motherboard connector.

Figure 7:
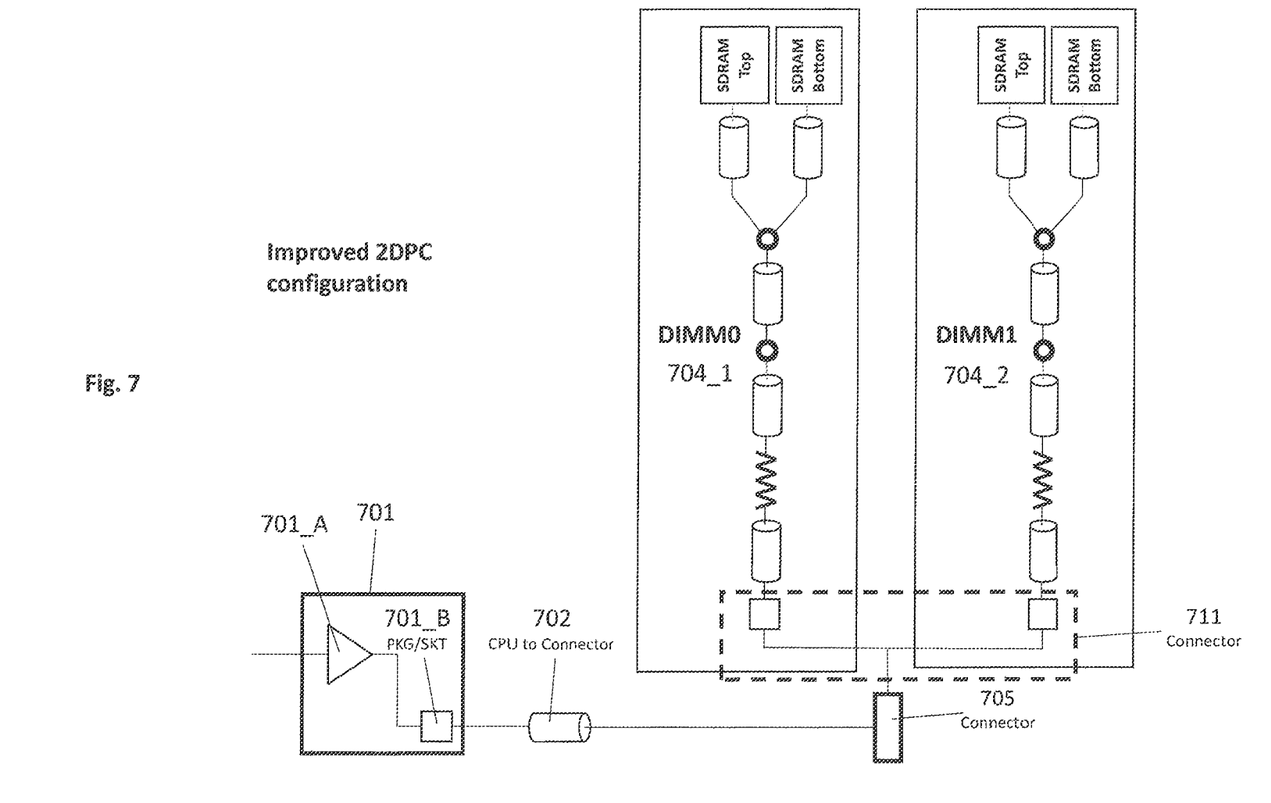
FIG. 7 shows a lumped element model of an improved memory channel.

FIG. 7 shows lumped element circuit model of the improved solution that can be compared with the lumped element circuitry model of the traditional memory channel originally presented in FIG. 3. As observed in FIG. 7, an adaptor card 711 is inserted between the larger motherboard connector 711 and both DIMMs 704_1, 704_2. Simplistically, the small form factor connectors that both DIMMs 704_1, 704_2 are assumed to be so small that there is no series resistance element or series inductance element for them in the model.

Figure 8:
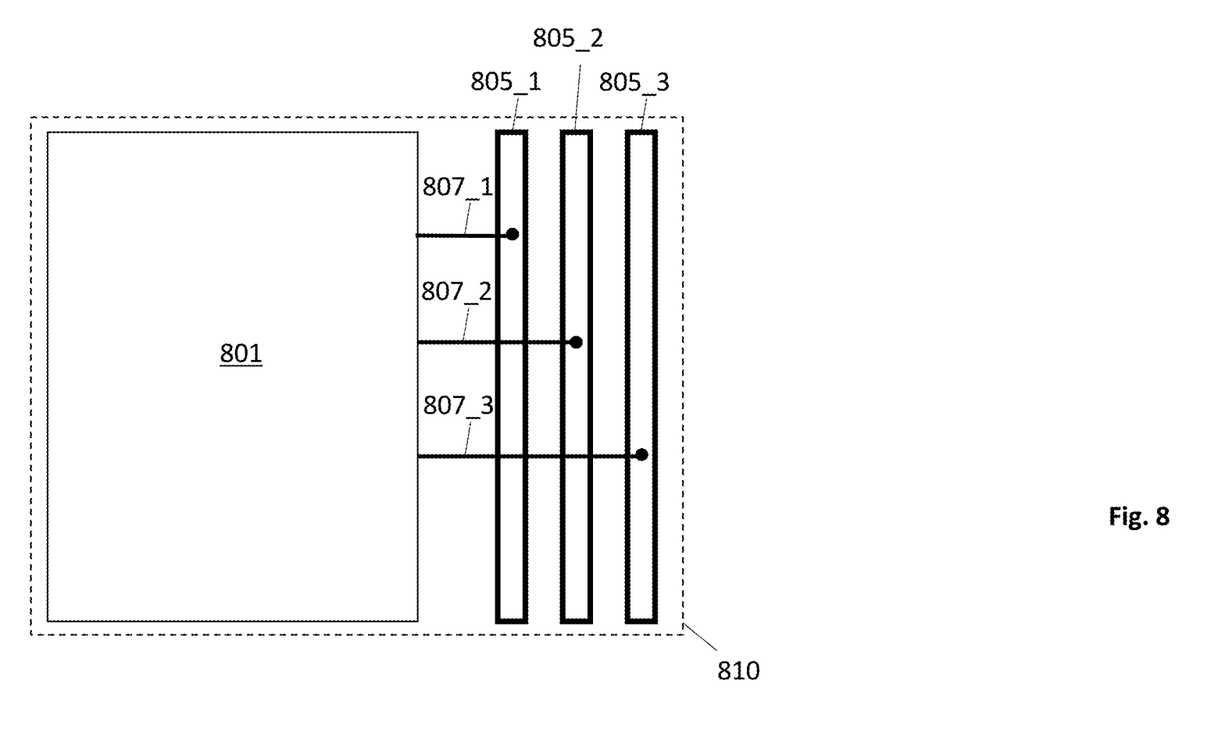
FIG. 8 shows a top down view of an improved memory channel.

FIG. 8 shows a top down view of the improved solution that can be directly compared with the traditional top down view originally depicted in FIG. 4. Here, space 801 corresponds to the motherboard surface area that is consumed by the semiconductor chip that includes the memory controller and signal trace groups 807_1, 807_2 and 807_3 correspond to the motherboard wiring for each of three DDR memory channels.

However, unlike the motherboard of FIG. 4 which included six large connectors that were laterally stacked across the horizontal dimension of the motherboard surface, by contrast, the improved solution only needs three larger motherboard connectors 805_1, 805_2, 805_3. That is, from the above discussions of FIGS. 5 through 7 it is evident that only one large connector is utilized per memory channel. As such, with the embodiment of FIG. 8 depicting three memory channels 807_1, 807_2, 807_3, only three large connectors are laterally stacked. With only three large connectors being laterally stacked, the improved approach realizes a dramatic improvement in motherboard surface area efficiency.

Figure 9A:
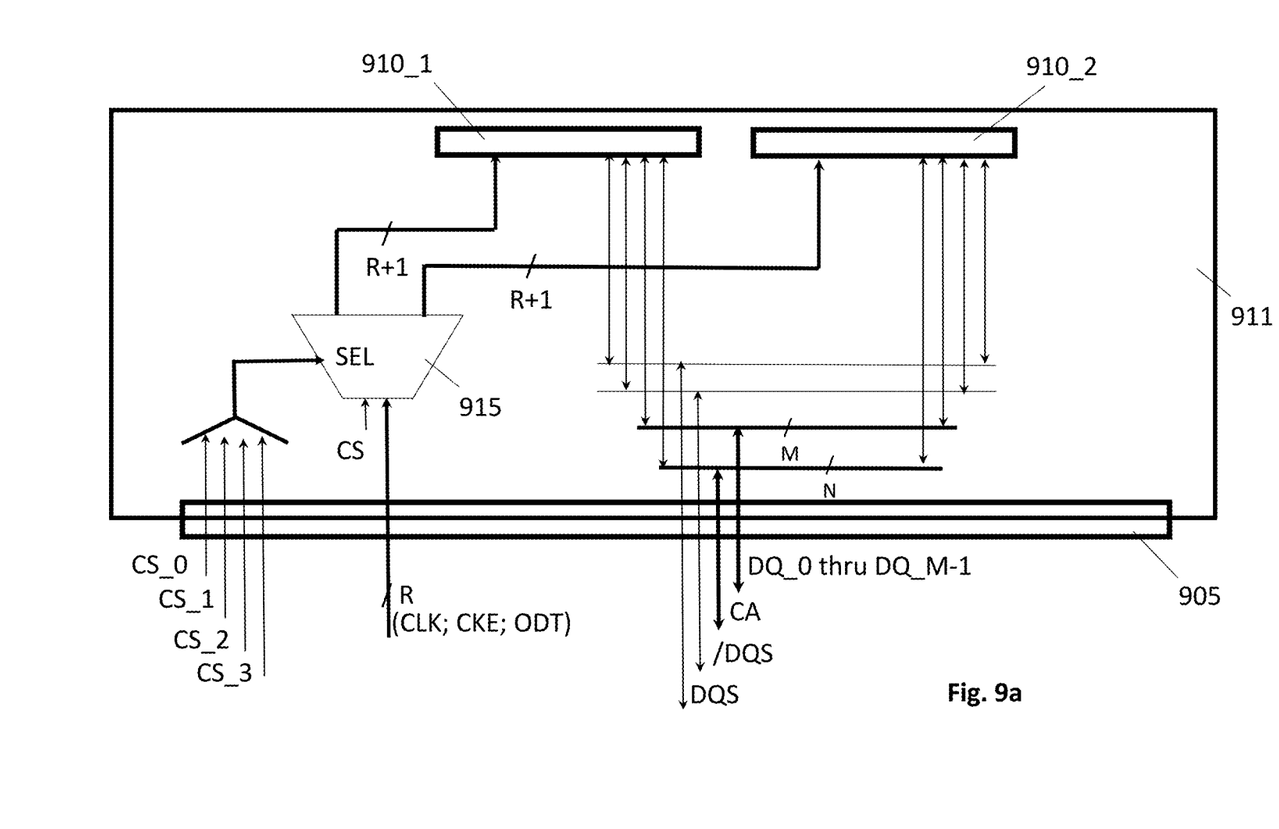
FIG. 9*a* shows an adaptor card of an improved memory channel.
Figure 9B:
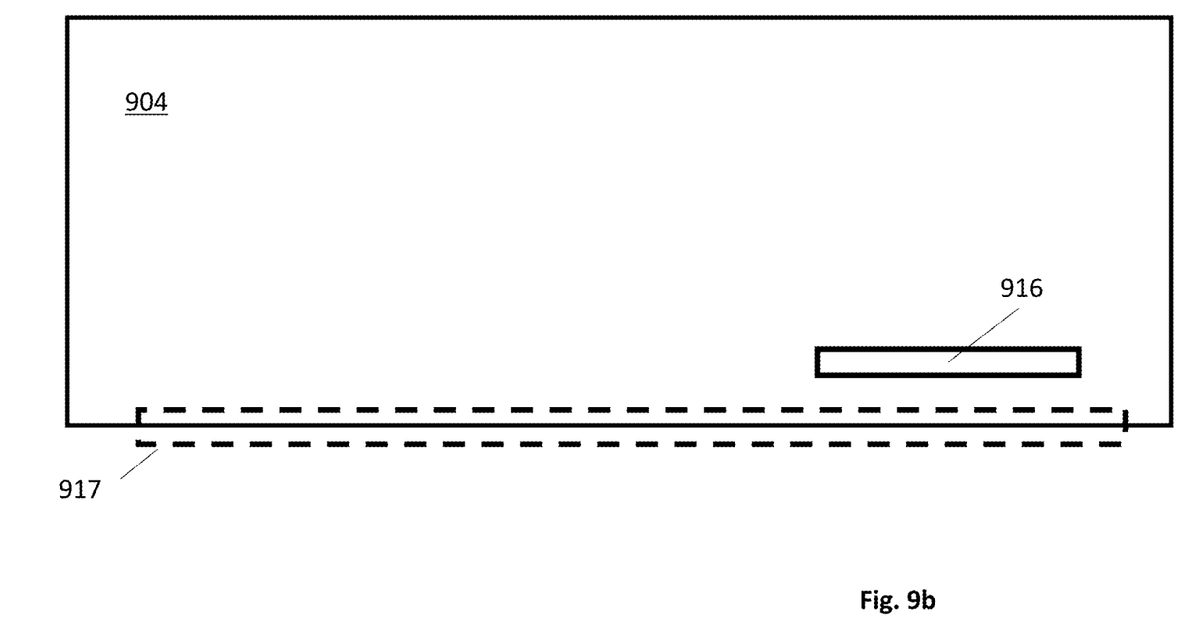
FIG. 9*b* shows a physical layout of an improved DIMM.

FIGS. 9a and 9b show more detailed views of an embodiment of the adaptor card 911. FIG. 9a shows a more detailed electrical schematic while FIG. 9b shows a more detailed physical layout. As observed in FIG. 9a, signal traces of the DDR memory channel that are shared bus signals (DQS, /DQS, the DQ bus and the CA bus) are implemented as a "T" in which the signal traces split on the adapter card 911 where a first end of the split runs to one of the smaller form factor connectors 510_1 and a second end of the split runs to the other of the smaller form factor connectors 510_2.

Other signal traces of the DDR memory channel that are custom run to a particular DIMM connector in the traditional approach or a particular DIMM in the traditional approach are multiplexed (by way of multiplexer 915) to the smaller form factor connector that is connected to the DIMM that is the target of a particular access. For example, as is known in the art, each of clock (CLK), clock enable (CKE), on die termination (ODT) and chip select (CS) are routed to individual DIMMs according to traditional approaches. Moreover, when a memory read or memory write targets the memory chips of a particular DIMM these signals are activated in order to perform the access.

In the improved approach of FIG. 9a, according to one embodiment, having different motherboard signals for different DIMMs is no longer necessary because all DIMMs are connected to a same motherboard connector. As such, as just one possibility, a "global set" of such signals is provided on corresponding traces of the motherboard. The signals are activated for all access that flow through the motherboard connector 905 (e.g., all memory accesses because all four DIMMs on the channel flow through connector 905) and routed to the multiplexer 915.

The multiplexer then routes the signals to whichever of the smaller form factor connectors 910_1, 910_2 is connected to the DIMM that is the target of the request. For example, if DIMM 0 is connected to connector 910_1 and DIMM 1 is connected to connector 910_2, the multiplexer 915 will route the signals to connector 910_1 if DIMM 0 is the target for the access or will route the signals to connector 910_2 if DIMM 1 is the target of the access. Adoption of a global set of signals reduces wiring complexity on the motherboard because fewer signal traces are needed as compared to a traditional approach.

In the embodiment of FIG. 9a, the CLK, CKE and ODT signals are globalized on the motherboard but the chip select signals still maintain an individual "per rank" dedication. That is CS_0, when activated, is understood to signify that rank 0 on DIMM 0 is the target of an access; CS_1, when activated, is understood to signify that rank 1 on DIMM 0 is the target of an access; CS_2, when activated, is understood to signify that rank 0 on DIMM 1 is the target of an access; and, CS_3, when activated, is understood to signify that rank 1 on DIMM 1 is the target of an access. As such, select logic circuitry (not shown in FIG. 9a for convenience) will provide a first binary value (e.g., a "0") to the SELECT input of multiplexer 915 if either of CS_0 and CS_1 are activated, or, will provide a second binary value (e.g., a "1") to the SELECT input of multiplexer 915 is either of CS_2 and CS_3 are activated. The select logic will also route whichever of the CS signals is activated to the input of the multiplexer 915 so that it too is routed to the correct smaller form factor connector.

Other embodiments may choose to preserve the traditional signaling approach and include custom per DIMM and/or per rank signals on the motherboard. Traces on the adaptor card then physically route the custom signals to their correct small form factor connector. Adaptor 511 of FIG. 5 suggests this approach.

Either approach (global set with multiplexer or traditional customized physical routing) can be used to support legacy DIMM cards that are not designed to plug-into a small form factor connector on an adapter card (they only plug into a large motherboard connector that is coupled to the motherboard according to traditional design approaches). That is, for instance, the system is designed to support one and two DIMM configurations. In the case of a one DIMM configuration, the DIMM connects directly to the large motherboard connector without the use of an adapter. According to this configuration, the motherboard wiring and overall memory channel operation is no different than a traditional single DIMM configuration.

If a two DIMM configuration is chosen, however, the adaptor is used and both DIMMs plug into it. In this case, the memory controller should be designed to comprehend the role of the adaptor and that all signals for two DIMMs are to be routed to one connector (rather than, as is presently done, the memory controller must activate one of two different sets of customized signals depending on which DIMM is the target of an access).

As such, the improved approach described herein supports the continued use of legacy DIMMs (that are not capable of plugging into a smaller form factor connector) for single DIMM memory channel configurations, and, the use of improved DIMMs (that are capable of plugging into a smaller form factor connector) for two DIMM configurations. Conceivably the adaptor could be used with an improved DIMM for a single DIMM configuration.

In this case, the adaptor card (whether it includes a multiplexer or not) will always route the signals to the correct form factor connector. Improved DIMM cards that are not only capable of plugging into a smaller form factor connector but are also designed to plug into the traditional larger motherboard connector can also be designed. Such DIMM cards could use the connection capability to a traditional large connector for use in an improved system in a single DIMM configuration, or, for use in a legacy system that does not contemplate multiple DIMMs per single motherboard connector.

FIG. 9b shows an embodiment 904 of the layout for an improved DIMM having the capability to connect to a small form factor connector that is disposed on an adapter card. For simplicity, FIG. 9b does not show any of the DIMM's semiconductor chips, such as memory chips and registering redriver chips. However, those of ordinary skill will understand that such chips exist. Moreover, memory chips at least may be disposed on both sides of the DIMM. For example, the memory chips of a first rank may be disposed on one side of the DIMM and the memory chips for a second rank may be disposed on the other side of the DIMM. Importantly, one of the sides of the DIMM includes a small form factor connector 916 for mating with the small form factor connector that is mounted on an adapter card as described at length above.

Optionally, the DIMM may also include a larger connector 917 for connecting to a traditional, larger motherboard DIMM connector. If the DIMM does include the larger connector 917, same signal nets that are common through the electrical interface of both connectors 916, 917 may be physically connected to one another in the DIMM's wiring, or, switching or multiplexing circuitry may be utilized as interface to ("in front of") the DIMM's semiconductor chips. Here, isolated "same" signal nets from both connectors may be routed to first and second inputs of such circuitry. Whichever connector is activated determines which input of the switching or multiplexing circuitry is enabled to provide signals to the DIMM's semiconductor chips.

Figure 9C:
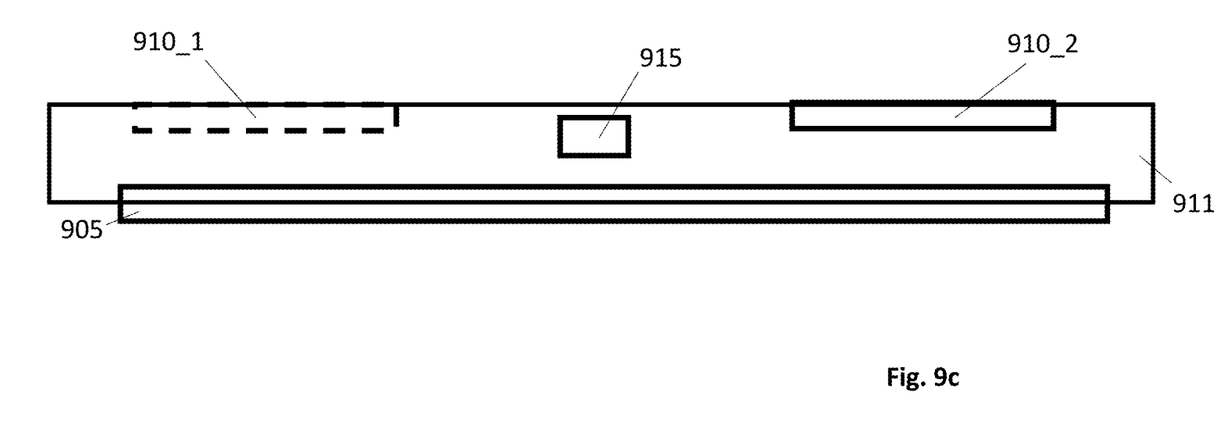
FIG. 9*c* shows a physical layout of an adaptor card for an improved memory channel.

FIG. 9c shows an embodiment of a physical layout for an adaptor card. As observed in FIG. 9c the adaptor card includes a larger connector 905 on its bottom side for connecting to a larger motherboard connector. Additionally the adaptor includes first and second smaller form factor connectors 910_1, 910_2 for connecting to first and second DIMMs respectively. Here, one of the smaller form factor connectors is disposed on one side of the adaptor card and the other of the smaller form factor connectors is disposed on the other side of the adaptor card. The adaptor card also may include active circuitry such as semiconductor chip 915 (which may include multiplexer logic circuitry as discussed above with respect to FIG. 9a). The substrate of the adaptor card, like the motherboard and the substrate of a DIMM, may be comprised of standard PC board material (e.g., comprising multiple alternating layers of patterned conductive and isolating materials (e.g., FR4, ceramic) to effect signal wires within the PC board).

The memory chips on the DIMMs may be composed of dynamic random access memory (DRAM) memory chips and/or an emerging non volatile memory that has sufficiently fast access times to permit its usage in a system memory role rather than a mass storage role. Examples of such emerging non volatile memories include, to name a few possibilities, a phase change based memory, a three dimensional crosspoint memory, "write-in-place" non volatile main memory devices, memory devices having storage cells composed of chalcogenide, multiple level flash memory, multi-threshold level flash memory, a ferro-electric based memory (e.g., FRAM), a magnetic based memory (e.g., MRAM), a spin transfer torque based memory (e.g., STT-RAM), a resistor based memory (e.g., ReRAM), a Memristor based memory, universal memory, Ge2Sb2Te5 memory, programmable metallization cell memory, amorphous cell memory, Ovshinsky memory, etc. Any of these technologies may be byte addressable so as to be implemented as a main/system memory in a computing system rather than traditional block or sector based non volatile mass storage.

Emerging non volatile random access memory technologies typically have some combination of the following: 1) higher storage densities than DRAM (e.g., by being constructed in three-dimensional (3D) circuit structures (e.g., a crosspoint 3D circuit structure)); 2) lower power consumption densities than DRAM (e.g., because they do not need refreshing); and/or, 3) access latency that is slower than DRAM yet still faster than traditional non-volatile memory technologies such as FLASH. The latter characteristic in particular permits various emerging non volatile memory technologies to be used in a main system memory role rather than a traditional mass storage role (which is the traditional architectural location of non volatile storage).

It is pertinent to point out that the DDR memory channel electrical interface (e.g., the names and specifications for various signals such as those memory channel signals discussed above) and/or mechanical interface (connector interface definitions) may be compliant with an industry standard specification such as a Joint Electron Device Engineering Council (JEDEC) promulgated DDR memory channel specification.

Figure 10:
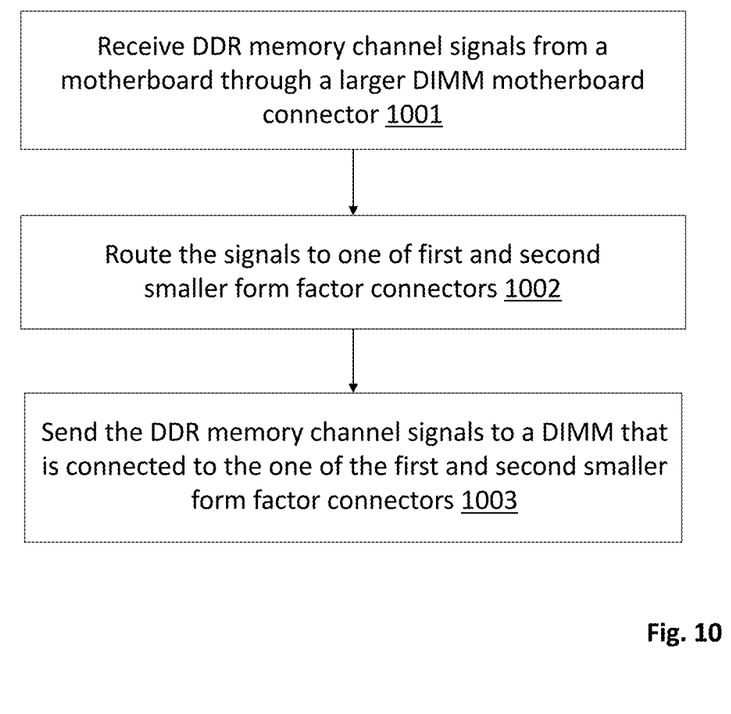
FIG. 10 shows a method of operating an improved memory channel.

FIG. 10 shows a method described above. The method includes receiving DDR memory channel signals from a motherboard through a larger DIMM motherboard connector 1001. The method includes routing the signals to one of first and second smaller form factor connectors 1002. The method includes sending the DDR memory channel signals to a DIMM that is connected to the one of the first and second smaller form factor connectors 1003.

Figure 11:
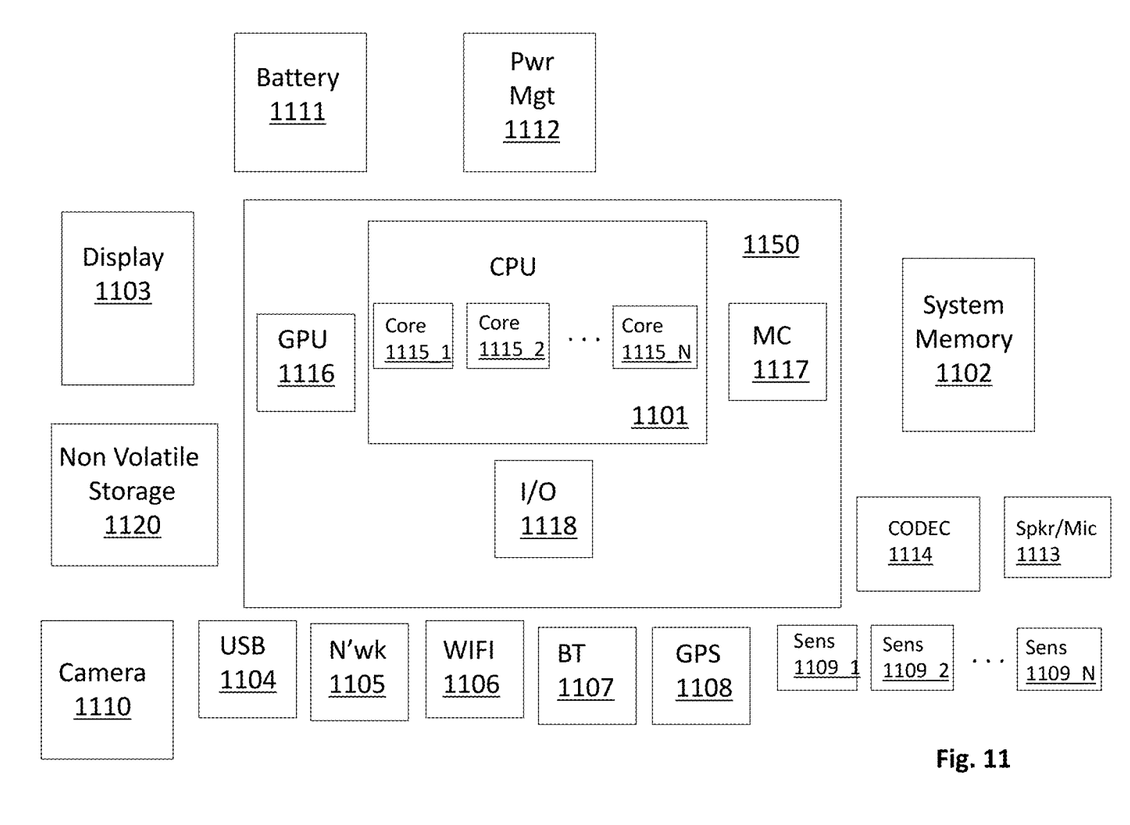
FIG. 11 shows a computing system.

FIG. 11 provides an exemplary depiction of a computing system 1100 (e.g., a smartphone, a tablet computer, a laptop computer, a desktop computer, a server computer, etc.). As observed in FIG. 11, the basic computing system 1100 may include a central processing unit 1101 (which may include, e.g., a plurality of general purpose processing cores 1115_1 through 1115_X) and a main memory controller 1117 disposed on a multi-core processor or applications processor, system memory 1102, a display 1103 (e.g., touchscreen, flat-panel), a local wired point-to-point link (e.g., USB) interface 1104, various network I/O functions 1105 (such as an Ethernet interface and/or cellular modem subsystem), a wireless local area network (e.g., WiFi) interface 1106, a wireless point-to-point link (e.g., Bluetooth) interface 1107 and a Global Positioning System interface 1108, various sensors 1109_1 through 1109_Y, one or more cameras 1110, a battery 1111, a power management control unit 1112, a speaker and microphone 1113 and an audio coder/decoder 1114.

An applications processor or multi-core processor 1150 may include one or more general purpose processing cores 1115 within its CPU 1101, one or more graphical processing units 1116, a memory management function 1117 (e.g., a memory controller) and an I/O control function 1118. The general purpose processing cores 1115 typically execute the operating system and application software of the computing system. The graphics processing unit 1116 typically executes graphics intensive functions to, e.g., generate graphics information that is presented on the display 1103. The memory control function 1117 interfaces with the system memory 1102 to write/read data to/from system memory 1102. The power management control unit 1112 generally controls the power consumption of the system 1100.

Each of the touchscreen display 1103, the communication interfaces 1104-1107, the GPS interface 1108, the sensors 1109, the camera(s) 1110, and the speaker/microphone codec 1113, 1114 all can be viewed as various forms of I/O (input and/or output) relative to the overall computing system including, where appropriate, an integrated peripheral device as well (e.g., the one or more cameras 1110). Depending on implementation, various ones of these I/O components may be integrated on the applications processor/multi-core processor 1150 or may be located off the die or outside the package of the applications processor/multi-core processor 1150.

The computing system may also include a system memory (also referred to as main memory) implemented with a connector technology that provides for more than one DIMM per motherboard DIMM connector as described at length above.

Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A computing system, comprising:
   a motherboard;
   a semiconductor chip mounted to the motherboard, the semiconductor chip comprising a plurality of processing cores and a memory controller that is coupled to the plurality of processing cores;
   a DIMM connector mounted to the motherboard, the DIMM coupled to the memory controller by way of DDR memory channel signal traces;
   an adaptor card plugged into the DIMM connector;
   first and second DIMMs coupled to the adaptor card with connectors that are smaller than the DIMM connector.

2. The computing system of claim 1 wherein the first and second DIMMs are respectively coupled to different sides of the adaptor card.

3. The computing system of claim 1 further comprising a thermally conductive structure sandwiched between the first and second DIMMs.

4. The computing system of claim 3 wherein the thermally conductive structure extends beyond the planar surface area of the first and second DIMMs.

5. The computing system of claim 1 wherein the adaptor card comprising a semiconductor chip.

6. The computing system of claim 5 wherein the semiconductor chip comprises multiplexer circuitry.

7. The computing system of claim 6 wherein a select input of the multiplexer circuitry is coupled down stream from first, second, third and fourth chip select signals of said DDR memory channel signal traces.

8. The computing system of claim 1 wherein at least one of the DIMM cards comprises a non volatile memory.

9. An adaptor card, comprising:
   a PC board substrate;
   a larger DIMM motherboard connector mounted on the PC board substrate; and
   first and second smaller DIMM connectors mounted on the PC board substrate, the PC board substrate comprising signal wiring between the larger DIMM motherboard connector and the first and second smaller DIMM connectors.

10. The adaptor card of claim 9 wherein the first and second smaller DIMM connectors are mounted on opposite sides of the PC board substrate.

11. The adaptor card of claim 9 wherein the signal wiring is to transport JEDEC memory channel signals.

12. The adaptor card of claim 9 wherein the adaptor card further comprises a semiconductor chip mounted on the adaptor card.

13. The adaptor card of claim 12 wherein the semiconductor chip comprises multiplexing circuitry.

14. The adaptor card of claim 13 wherein a select input of the multiplexing circuitry is coupled downstream from multiple channel select signals of the memory channel.

15. A DIMM, comprising:
   a PC board substrate;
   memory chips mounted on both sides of the PC board substrate; and,
   a small form factor connector mounted on a planar surface of the PC board substrate such that electrical signals that pass through the small form factor connector's electrical interface are oriented to run normally to and or from the planar surface of the PC board substrate and not normally to and/or from an edge of the PC board substrate.

16. The DIMM of claim 15 further comprising a large motherboard connector on a bottom edge of the PC board substrate.

17. The DIMM of claim 15 in which the memory chips comprise DRAM memory chips.

18. The DIMM of claim 15 in which the memory chips comprises non volatile memory chips.

19. The DIMM of claim 15 wherein the electrical interface comprises connections for signals of a JEDEC DDR memory channel.

20. A method, comprising:
   receiving DDR memory channel signals from a motherboard through a larger DIMM motherboard connector;
   routing the signals to one of first and second smaller form factor connectors;
   sending the DDR memory channel signals to a DIMM that is connected to the one of the first and second smaller form factor connectors.

* * * * *